(12) United States Patent
Wu

(10) Patent No.: US 8,981,274 B2
(45) Date of Patent: Mar. 17, 2015

(54) OPTICAL-ELECTRICAL CONVERTING DEVICE WITH INCREASED TRANSMITTING EFFICIENCY

(75) Inventor: Kai-Wen Wu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 255 days.

(21) Appl. No.: 13/552,659

(22) Filed: Jul. 19, 2012

(65) Prior Publication Data
US 2013/0306837 A1 Nov. 21, 2013

(30) Foreign Application Priority Data

May 16, 2012 (TW) .............................. 101117483 A

(51) Int. Cl.
G01J 1/44 (2006.01)
H01J 40/14 (2006.01)
H05K 1/11 (2006.01)
H05K 3/34 (2006.01)

(52) U.S. Cl.
CPC .............. *H05K 1/111* (2013.01); *H05K 3/3452* (2013.01); *H05K 2201/099* (2013.01); *H05K 2201/10106* (2013.01); *H05K 2201/10121* (2013.01)
USPC ..................................... 250/206; 250/227.28

(58) Field of Classification Search
USPC .................. 250/206, 227.11, 227.28, 227.14; 385/33, 39, 55, 54, 60, 61, 65, 72–73, 385/76–78, 89, 93, 92
See application file for complete search history.

(56) References Cited

U.S. PATENT DOCUMENTS

| 2004/0042705 | A1* | 3/2004 | Uchida et al. ................... 385/14 |
| 2005/0157990 | A1* | 7/2005 | Mazotti et al. .................. 385/94 |
| 2010/0104290 | A1* | 4/2010 | Nobuhara et al. ............... 398/82 |
| 2011/0058771 | A1* | 3/2011 | Lee et al. ........................ 385/33 |

* cited by examiner

*Primary Examiner* — Francis M Legasse, Jr.
(74) *Attorney, Agent, or Firm* — Novak Druce Connolly Bove + Quigg LLP

(57) ABSTRACT

An optical-electrical converting device includes a substrate, an electrical circuit layer, at least one auxiliary pad, and an optical-electrical converting lens. The electrical circuit layer includes at least one circuit portion. The optical-electrical lens includes at least one first supporting portion and at least one second supporting portion. Each of the at least one first supporting portion is positioned on a respective one of the at least one first circuit portion, and each of the at least one second supporting portion is positioned on a respective one of the at least one auxiliary pad. The electrical circuit layer and the at least one auxiliary pad are arranged on the substrate. The thickness of the at least one first circuit portion layer is substantially equal to the thickness of the at least one auxiliary pad.

11 Claims, 2 Drawing Sheets

OPTICAL-ELECTRICAL CONVERTING DEVICE WITH INCREASED TRANSMITTING EFFICIENCY

BACKGROUND

1. Technical Field

The present disclosure relates to an optical-electrical converting device.

2. Description of Related Art

Optical-electrical converting devices usually include a printed circuit board (PCB), a light emitting module, and a coupling lens. The light emitting module is positioned on the PCB. The coupling lens includes a converging lens for converging light rays from the light emitting module, and thus the converging lens needs to be aligned with the light emitting module.

The PCB includes a substrate and an electrical circuit layer positioned on the substrate, and thus the electrical circuit layer is located higher than the substrate. The Coupling lens is usually positioned on the PCB through four supporting portions. However, some of the four supporting portions directly resist on the electrical circuit layer, the other of the four supporting portions directly resist on the substrate. Therefore, the converging lens cannot be aligned with the light emitting module, which will reduce the transmitting efficiency of the optical-electrical converting device.

Therefore, it is desirable to provide an optical-electrical converting device that can overcome the above-mentioned limitations.

BRIEF DESCRIPTION OF THE DRAWINGS

Many aspects of the embodiments should be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
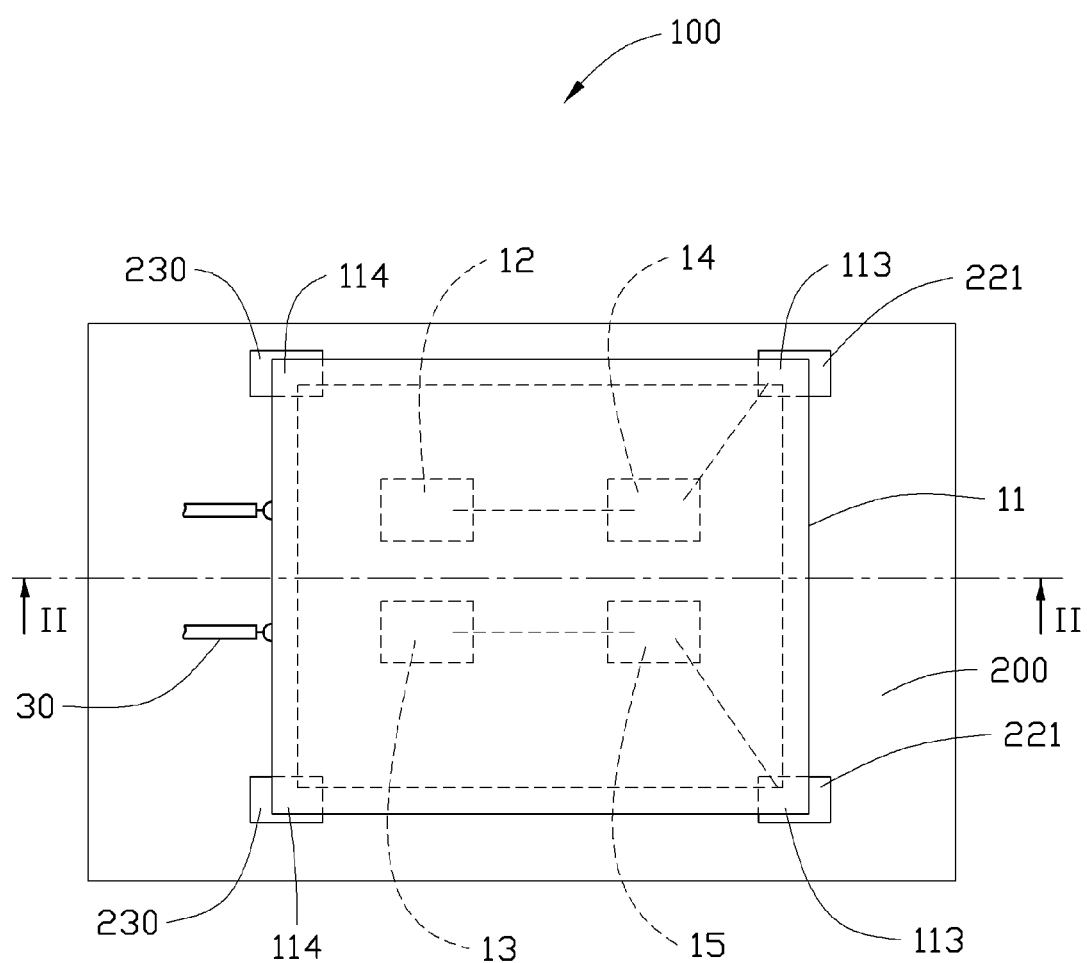
FIG. 1 is a schematic view of an optical-electrical converting device, according to an exemplary embodiment.
Figure 2:
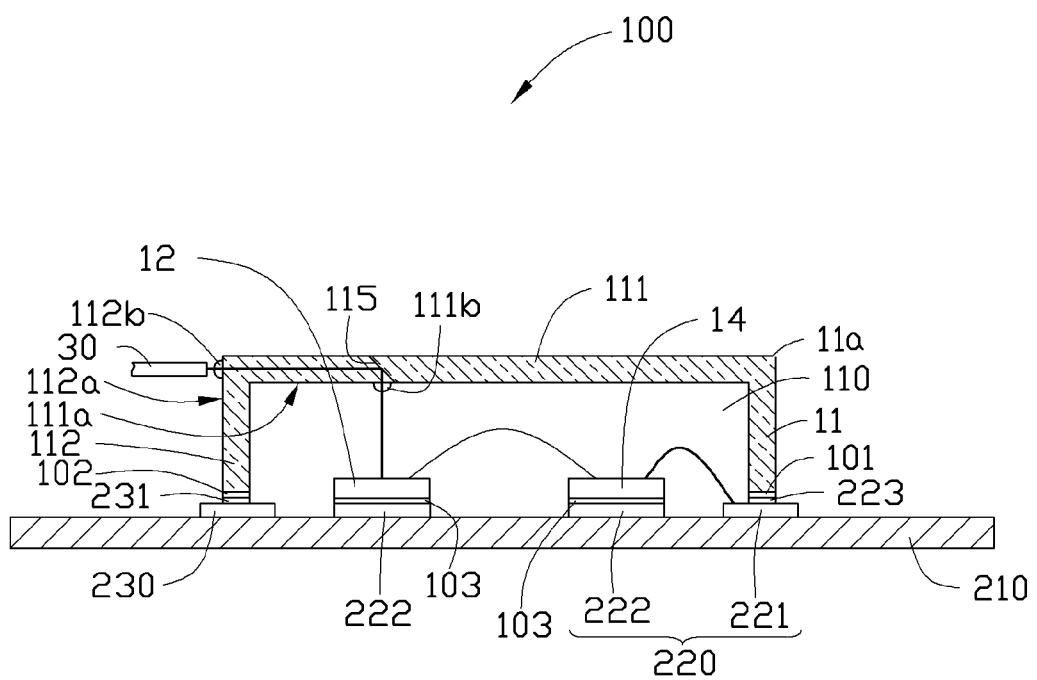
FIG. 2 is a cross-sectional view of the optical-electrical converting device taken along a line II-II of FIG. 1.

Referring to FIG. 1 and FIG. 2, an optical-electrical converting device 100, according to an embodiment, is shown. The optical-electrical converting device 100 includes a PCB 200, two auxiliary pads 230, a coupling lens 11, a light emitting module 12, a light receiving module 13, a first chip 14, a second chip 15, and a number of optical fibers 30.

The PCB 200 includes a substrate 210 and an electrical circuit layer 220. The electrical circuit layer 220 includes two first circuit portions 221 and four second circuit portions 222. The four second circuit portions 222 are electrically disconnected to the two first circuit portions 221. The light emitting module 12, the light receiving module 13, the first chip 14, and the second chip 15 are electrically connected to the second circuit portions 222 and are fixed on the second circuit portions 222 through four conductive glue layers 103 respectively. In the embodiment, the four conductive glue layers 103 are made of silver colloid. Each of the two first circuit portions 221 is partially covered with a first solder mask layer 223.

The Coupling lens 11 includes a main body 11a, two first converging lenses 111b, two second converging lenses 112b, and a reflecting mirror 115. The main body 11a is substantially cuboid and defines a receiving groove 110. The receiving groove 110 has a top wall 111 and four sidewalls 112 connected to the top wall 111. Two first supporting portions 113 and two second supporting portions 114 are formed at four intersection portions of the four sidewalls 112.

The two first supporting portions 113 and the two second supporting portions 114 are positioned on the PCB 200. The two first supporting portions 113 resist on and are fixed on the corresponding first solder mask layers 223 through two first glue layers 101. The two second supporting portions 114 resist on the substrate 210 through the two auxiliary pads 230. In particular, the two auxiliary pads 230 are sandwiched between the two second supporting portions 114 and the substrate 210. Each of the two auxiliary pads 230 has two opposite surfaces. One surface is directly positioned on the substrate 210, and the other surface is covered with a second solder mask layer 231. Each of the two second supporting portions 114 is fixed on the corresponding second solder mask layer 231 through a second glue layer 102. The thickness of each of the auxiliary pads 230 is substantially equal to the thickness of each of the first circuit portions 221. The thickness of the second solder mask layer 231 is substantially equal to the thickness of the first solder mask layer 223. The thickness of the second glue layer 102 is substantially equal to the thickness of the first glue layer 101, and thus the top wall 111 is parallel to the substrate 210. In the embodiment, the two auxiliary pads 230 are electrically disconnected to the electrical circuit layer 220, and the first glue layer 101 and the second glue layer 102 are made of ultraviolet glue.

The top wall 111 has an inner surface 111a. One of the four sidewalls 112 has an outer surface 112a. The two first converging lenses 111b are positioned on the inner surface 111a, and are aligned with the light emitting module 12 and the light receiving module 13 respectively. The two second converging lenses 112b are positioned on the outer surface 112a at an intersection portion of the top wall 111 and the side wall 112 and are corresponding to the two first converging lenses 111b respectively. The reflecting mirror 115 is received in the top wall 111 and is used for reflecting light rays from the first converging lenses 111b to the corresponding second converging lenses 112b and also used for reflecting light rays from the second converging lenses 112b to the corresponding first converging lenses 111b.

The number of the reflecting mirror 115 also can be more than one (such as two), and the reflecting mirrors 115 are corresponding to the first converging lenses 111b and the second converging lenses 112b. The number of the first converging lenses 111b is equal to or more than the sum of the light emitting module 12 and the light receiving module 13. The number of the second converging lens 112b is equal to or more than the number of the first converging lens 111b.

The light emitting module 12, the light receiving module 13, the first chip 14, and the second chip 15 are received in the receiving grooves 110. The two first converging lenses 111b are optically aligned with the light emitting module 12 and the light receiving module 13 respectively. The first chip 14 is electrically connected to the light emitting module 12, and the second chip 15 is electrically connected to the light receiving module 13.

The first chip 14 is used for providing a first electrical signal to the light emitting module 12. The light emitting module 12 is used for converting the first electrical signal into a first optical signal and emitting the first optical signal to another optical-electrical converting device (not shown). The light receiving module 13 is used for receiving a second optical signal from another optical-electrical converting device (not shown) and converting the second optical signal into a second electrical signal. The second chip 15 is electrically connected to the light receiving module 13 and is used for converting the second electrical signal into a third electrical signal. In the embodiment, the light emitting module 12 is a laser diode, the light receiving module 13 is a photo diode. In the embodiment, both of the first electrical signal and the second electrical signal are current signals, and the third electrical signal is voltage signal.

The two optical fibers 30 are aligned with the two second converging lenses 112b respectively and are used for transmitting the first optical signal and the second optical signal.

In use, when the optical-electrical device 100 is used as an optical emitting terminal, the light emitting module 12 converts the first electrical signal from the first chip 14 to the first optical signal. The first optical signal is converged by the first converging lens 111b and then reflected by the reflecting lens 115 to the corresponding second converging lens 112b, at last enters another optical-electrical device (not shown).

When the optical fiber connector 100 is used as an optical receiving terminal, the second optical signal from the another optical-electrical device (not shown) is converged by the second converging lens 112b and is reflected by the reflecting lens 111b, and then enters the light receiving module 13.

By employing the two auxiliary pads 230 sandwiched the second supporting portions 222 and the substrate 210, orientation of the Coupling lens 11 can be easily adjusted and the two first converging lenses 111b will be easy to be aligned with the light emitting module 12 and the light receiving module 13 respectively, and thus the signal transmitting efficiency is improved.

In the embodiment, the number of the first circuit portions 221 is equal to the number of the first supporting portion 113s; the number of the auxiliary pads 230 is equal to the number of the second supporting portions 114. The numbers of the first supporting portion 113, the second supporting portion 114, the first circuit portion 221, and the second circuit portion 222 is not limited.

In other embodiments, the first solder mask layer 223 and the second solder mask layer 231 can be omitted.

It will be understood that the above particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. An optical-electrical converting device, comprising:
a printed circuit board (PCB) comprising:
 a substrate;
 an electrical circuit layer comprising at least one first circuit portion;
 at least one auxiliary pad; and
a coupling lens comprising at least one first supporting portion and at least one second supporting portion, each of the at least one first supporting portion positioned on a respective one of the at least one first circuit portion, each of the at least one second supporting portion positioned on a respective one of the at least one auxiliary pad;
at least one light emitting module; and
at least one light receiving module;
wherein the coupling lens comprises a main body defining a receiving groove, the receiving groove has a top wall and a plurality of sidewalls connected to the top wall, the at least one first supporting portion and the at least one second supporting portion are intersection portions of the sidewalls; the coupling lens further comprises at least two first converging lenses, the at least two first converging lenses are positioned on an inner surface of the top wall and are aligned with the at least one light emitting module and at least one light receiving module respectively, the PCB comprises at least two second circuit portions, each of the at least one light emitting module and at least one light receiving module are positioned on a respective one of the at least two second circuit portions;
wherein the electrical circuit layer and the at least one auxiliary pad are arranged on the substrate, a thickness of each of the at least one first circuit portion is substantially equal to a thickness of each of the at least one auxiliary pad.

2. The optical-electrical converting device of claim 1, wherein each of the at least one first circuit portion is partially covered with a solder mask layer, each of the at least one supporting portion is fixed on the respective first solder mask layer, each of at least one auxiliary pad is covered with a second solder mask layer, a thickness of the second solder mask layer is substantially equal to a thickness of the first solder mask layer, each of the at least one second supporting portion is fixed on the respective second solder mask layer.

3. The optical-electrical converting device of claim 1, wherein each of the at least one first supporting portion is fixed on the respective first circuit portion through a first glue layer, each of the at least one second supporting portion is fixed on the respective auxiliary pad through a second glue layer, a thickness of the first glue layer is substantially equal to a thickness of the second glue layer.

4. The optical-electrical converting device of claim 1, wherein each of the at least two second circuit portions is covered with a conductive glue layer, and each of the at least one light emitting module and at least one light receiving module is adhered on the respective one of the at least two second circuit portions through the corresponding conductive glue layer.

5. The optical-electrical converting device of claim 1, wherein the coupling lens further comprises at least two second converging lenses and at least one reflecting lens, the at least two second converging lenses are positioned on an outer surface of one of the sidewalls and are corresponding to the at least two first converging lenses respectively, the at least one reflecting lens is received in the top wall and is configured for reflecting light rays from each first converging lens to the corresponding second converging lens and further configure for reflecting light rays from each second converging lens to the corresponding first converging lens.

6. The optical-electrical converting device of claim 1, wherein the at least one auxiliary pad is electrically disconnected to the electrical circuit layer.

7. The optical-electrical converting device of claim 2, wherein each of the at least one first supporting portion is fixed on the respective first solder mask layer through a first glue layer, each of the at least one second supporting portion is fixed on the respective second solder mask layer through a second glue layer, a thickness of the first glue layer is substantially equal to a thickness of the second glue layer.

8. The optical-electrical converting device of claim 7, wherein both of the first glue layer and the second glue layer are made of ultraviolet glue.

9. The optical-electrical converting device of claim 3, wherein both of the first glue layer and the second glue layer are made of ultraviolet glue.

10. The optical-electrical converting device of claim 4, wherein the conductive layer is made of silver colloid.

11. The optical-electrical converting device of claim 5, wherein the optical-electrical converting device further comprises at least two fibers, each of the at least two fibers is aligned with a respective one of the at least two second converging lenses.

* * * * *